(12) United States Patent
Yu et al.

(10) Patent No.: US 8,710,496 B2
(45) Date of Patent: Apr. 29, 2014

(54) ORGANIC LIGHT EMITTING DIODE DEVICE AND FABRICATION METHOD THEREOF

(71) Applicant: Electronics and Telecommunications Research Institute, Daejeon (KR)

(72) Inventors: Byoung Gon Yu, Chungcheongbuk-do (KR); Jeong Ik Lee, Gyeonggi-do (KR); Doo-Hee Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/690,635

(22) Filed: Nov. 30, 2012

(65) Prior Publication Data

US 2013/0264546 A1  Oct. 10, 2013

(30) Foreign Application Priority Data

Apr. 5, 2012  (KR) ........................ 10-2012-0035503

(51) Int. Cl.
*H01L 35/24* (2006.01)
*H01L 51/00* (2006.01)

(52) U.S. Cl.
USPC ................. 257/40; 257/79; 257/E39.007

(58) Field of Classification Search
USPC .................. 257/2, 40, 79, 98, E39.007
See application file for complete search history.

(56) References Cited

U.S. PATENT DOCUMENTS

| | | | |
|---|---|---|---|
| 2010/0150513 A1 | 6/2010 | Zhang et al. | |
| 2010/0330716 A1 | 12/2010 | Tyan et al. | |
| 2011/0248249 A1* | 10/2011 | Forrest et al. | 257/40 |

FOREIGN PATENT DOCUMENTS

| | | |
|---|---|---|
| JP | 2004-127942 A | 4/2004 |
| KR | 10-2009-0120956 A | 11/2009 |
| KR | 10-2010-0035134 A | 4/2010 |
| KR | 10-2010-0073228 A | 7/2010 |
| KR | 10-2011-0095009 A | 8/2011 |

OTHER PUBLICATIONS

Masayuki Fujita et al., "Optical and Electrical Characteristics of Organic Light-Emitting Diodes with Two-Dimensional Photonic Crystals in Organic/Electrode Layers" Japanese Journal of Applied Physics, Jun. 2005, pp. 3669-3677, vol. 44, No. 6A.

J. P. Yang et al., "Light out-coupling enhancement of organic light-emitting devices with microlens array", Applied Physics Letters, Dec. 1, 2010, pp. 223303-223303-3, vol. 97, Issue 22.

Soon Moon Jeong et al., "Enhancement of Light Extraction from Organic Light-Emitting Diodes with Two-Dimensional Hexagonally Nanoimprinted Periodic Structures Using Sequential Surface Relief Grating", Japanese Journal of Applied Physics, Jun. 13, 2008, pp. 4566-4571, vol. 47, No. 6.

* cited by examiner

*Primary Examiner* — Hoai V Pham
(74) *Attorney, Agent, or Firm* — Rabin & Berdo, P.C.

(57) ABSTRACT

Disclosed are an organic light emitting diode device and a method of fabricating the organic light emitting diode device capable of achieving high light extraction efficiency even without a high-cost and complicated process. The organic light emitting diode device according to an exemplary embodiment of the present disclosure includes a substrate; a phase change thin film layer formed on the substrate and formed of a phase change material changeable from an amorphous state to a crystalline state or from a crystalline state to an amorphous state; and an anode electrode layer, an organic light emitting layer and a cathode electrode layer which are sequentially formed on the phase change thin film layer.

13 Claims, 5 Drawing Sheets

ORGANIC LIGHT EMITTING DIODE DEVICE AND FABRICATION METHOD THEREOF

CROSS-REFERENCE TO RELATED APPLICATIONS

This application is based on and claims priority from Korean Patent Application No. 10-2012-0035503, filed on APR 5, 2012, with the Korean Intellectual Property Office, the disclosure of which is incorporated herein in its entirety by reference.

TECHNICAL FIELD

The present disclosure relates to an organic light emitting diode device using a phase change material and a method of fabricating the organic light emitting diode device.

BACKGROUND

FIG. 1 is a diagram illustrating an organic light emitting diode (OLED) device and an optical path inside the OLED device in the related art.

Referring to FIG. 1, the OLED device in the related art includes a transparent substrate 110, and an anode layer 120, an organic light emitting layer 130 and a cathode layer 140 which are sequentially formed on the substrate 110. The organic light emitting layer 130 includes a hole injection/transport layer 131 in a lower part and an electron injection/transport layer 133 in the upper part. In a general bottom emission type device, the anode layer 120 uses a transparent electrode, such as indium tin oxide (ITO), and the cathode layer 140 uses a metal having high reflectivity, such as aluminum. A sealed protection layer 150 configured to protect the organic light emitting layer 130 is formed on the cathode layer 140 or the cathode layer 140 is packaged with a glass plate, etc.

The OLED device illustrated in FIG. 1 is generally formed of a thin film having a thickness of about λ/4 (λ is a wavelength of light), and brightness, an optical spectrum and various angle dependence of the OLED device are remarkably changed by an optical phenomenon, such as multiple reflection, light interference, light absorption and light scattering generated in boundary surfaces and insides of the respective layers.

According to Thompson, et al., it is known that efficiency of an external energy indicating luminous efficiency of an organic electroluminescence device can be represented by a multiplication of internal energy efficiency of a device and light extraction efficiency, and the light discharged from the organic light emitting layer 130 fails to be discharged to the outside of the substrate 110 by total reflection, etc., and is held in the insides of the respective layers in a process of passing through the boundary surfaces of the respective layers having different refractive indexes, so that the external luminous efficiency cannot exceed 20% (Optics Letters 22, 6, 396, 1997). Light confined in the respective layers within the OLED device and waveguided inside of the respective layers is referred to as waveguide mode light, and light discharged to the outside after passing through the boundary surfaces of the respective layers is referred to as discharge mode light. Conversion of the waveguide mode light into the discharge mode light in a surface light source device in a form of a panel and emission of the converted light to the outside of the device is referred to as light extraction.

In an OLED device manufactured on a flat substrate having the refractive index of 1.5 in the related art, since light generated in the organic light emitting layer 130 is reflected in the cathode layer 140 or is discharged toward the anode layer 120, most of the generated light is finally discharged toward the anode layer 120. However, in a process of discharging the light to the air after passing through the organic light emitting layer 130, the anode layer 120 and the substrate 110, refraction or reflection is generated in the respective boundary surfaces due to the difference in the refractive indexes of the boundary surface between the organic light emitting layer 130 and the anode layer 120, the boundary surface between the anode layer 120 and the substrate 110 and the boundary surface between the substrate 110 and the air. Especially, by the Snell's Law below (Equation 1), from a medium having a high refractive index to a medium having a low refractive index, lights incident to a surface of the substrate 110 at an angle equal to or larger than a threshold angle with respect to a vertical direction of the boundary surface is totally reflected, so that the light cannot be discharged to the outside and is dissipated within the device.

$$n_1/n_2 = \sin a_2 / \sin a_1 \quad \text{[Equation 1]}$$

Here, $n_1$ is a refractive index of a material before incidence, $n_2$ is a refractive index of a material after incidence, $a_1$ is an incident angle with respect to a normal line of an incident surface, and $a_2$ is a refraction angle with respect to a normal line of an incident surface.

Particularly, a visible ray refractive index of the general organic light emitting layer 130 is in the range of 1.7 to 1.9, and a reflective index of the ITO used as the anode layer 120 is in the range of 1.9 to 2.0, so that the total reflection between the two layers is not the problem. However, since a refractive index of a general glass or the plastic transparent substrate 110 is approximately 1.5, and the organic light emitting layer 130 and the anode layer 120 are very thin to the extent of several hundreds of nm, most of the light generated in the organic light emitting layer 130 is incident at an angle to be substantially parallel to the surface of the substrate 110, so that the incident light is confined as the waveguide mode light in the anode layer 120. The quantity of the waveguide mode light confined and dissipated in the organic light emitting layer 130 and the anode layer 120 due to the total reflection greatly increases to the extent of 60% of the total light emission amount, so that approximately 20% of the light is dissipated by the internal total reflection even in the substrate 110.

FIG. 2 is a diagram illustrating the OLED device in the related art employing an improved structure in order to improve light extraction efficiency and an optical path within the OLED device.

Referring to FIG. 2, in the related art, a method of improving the light extraction efficiency by forming a light scattering layer 111 between the substrate 110 and the anode layer 120 or forming a micro lens array layer 101 under the substrate 110 is mainly used. The reason is that in order to remove the waveguide mode light, a thickness from the organic light emitting layer 130 to the air that has a refractive index of 1.0 needs to be very small, that is, 20 nm or less, but it is difficult to physically implement such a very small thickness therebetween.

For the light scattering layer 111, a method of forming unevenness by using a material having a high refractive index and a material having a low refractive index or forming a scattering layer having different sizes of particles by using nanoparticles is used. However, such a process is considerably complicated and requires high costs, and especially, several technical difficulties are generated in a process of performing planarization again after the forming of the unevenness.

When the micro lens array layer 101 is formed so as to solve the problem of the total reflection between the substrate 110 and the outside air, a method of forming a micro lens on a film having the similar refractive index to that of the substrate 110 and then attaching the film to an external surface of the substrate 110 and a method of patterning and then etching the external surface of the substrate 110, and directly engraving a shape of the micro lens are used. In this case, in order to form the material of the micro lens and an unevenness pattern to have various shapes, such as a pyramid, a pillar, a wave and other irregular patterns, a large number of lithography processes and etching processes is required, thereby causing a problem of a considerable increase in the process costs.

SUMMARY

The present disclosure has been made in an effort to provide an organic light emitting diode device and a method of fabricating the organic light emitting diode device, which achieves high light extraction efficiency even without a high-cost and complex process by forming a phase change thin film layer by using a phase change material of which a state is changeable from an amorphous state to a crystalline state or from a crystalline state to an amorphous state by heat or light.

An exemplary embodiment of the present disclosure provides an organic light emitting diode device including: a substrate; a phase change thin film layer formed on the substrate and formed of a phase change material changeable from an amorphous state to a crystalline state or from a crystalline state to an amorphous state; and an anode electrode layer, an organic light emitting layer and a cathode electrode layer which are sequentially formed on the phase change thin film layer.

A state of the phase change thin film layer may be reversibly changeable by heat or light supplied from an outside.

The phase change thin film layer may be formed in an amorphous or crystalline state according to a heat treatment condition including a temperature and a heating rate.

A fine unevenness pattern may be formed on the phase change thin film layer due to a volume change by laser radiation, and a size and a form of the unevenness pattern may be determined by adjusting a size of a laser spot.

Another exemplary embodiment of the present disclosure provides an OLED device including: a substrate; first and second phase change thin film layers formed on and under the substrate, respectively, and formed of a phase change material changeable from an amorphous state to a crystalline state or from a crystalline state to an amorphous state; and an anode electrode layer, an organic light emitting layer and a cathode electrode layer which are sequentially formed on the first phase change thin film layer.

Yet another exemplary embodiment of the present disclosure provides a method of fabricating an organic light emitting diode device, including: forming a phase change thin film layer in an amorphous state on a substrate, the phase change thin film layer being formed of a phase change material changeable from an amorphous state to a crystalline state or from a crystalline state to an amorphous state; sequentially forming an anode electrode layer, an organic light emitting layer and a cathode electrode layer on the phase change thin film layer; and partially or entirely changing the phase change thin film layer in the amorphous state to be in a crystalline state by applying heat or light to the phase change thin film layer.

According to the exemplary embodiments of the present disclosure, it is possible to form a phase change thin film layer functioning as a light scattering layer through a simple process by using a phase change material of which the state is reversibly changeable by heat or light. Through this, light loss within the organic light emitting diode device may be decreased, thereby substantially improving light extraction efficiency.

The fine unevenness pattern is formed on the phase change thin film layer by using laser, thereby achieving the same effect as forming a micro lens array through a simple process.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Figure 1:
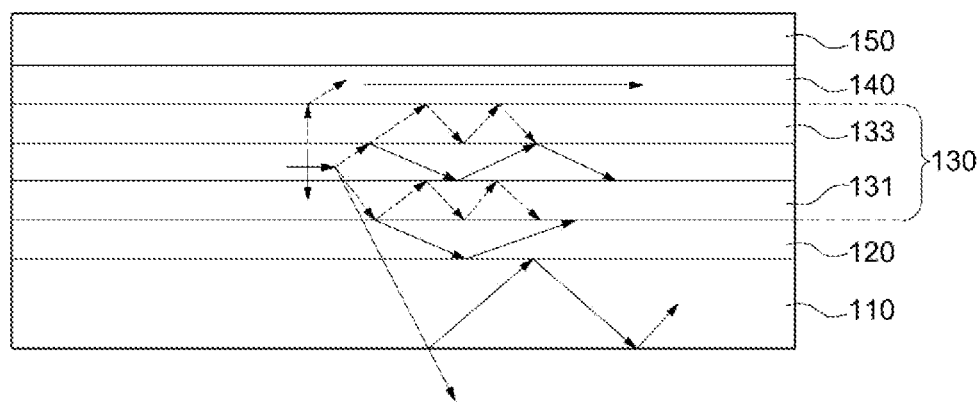
FIG. 1 is a diagram illustrating an organic light emitting diode (OLED) device and an optical path inside the OLED device in the related art.
Figure 2:
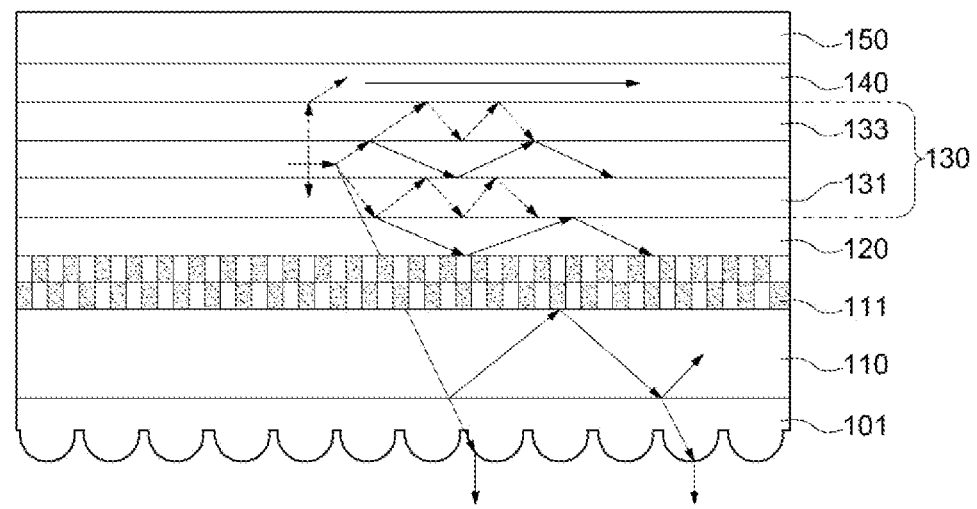
FIG. 2 is a diagram illustrating an OLED device in the related art employing an improved structure in order to improve light extraction efficiency and an optical path within the OLED device.
Figure 3:
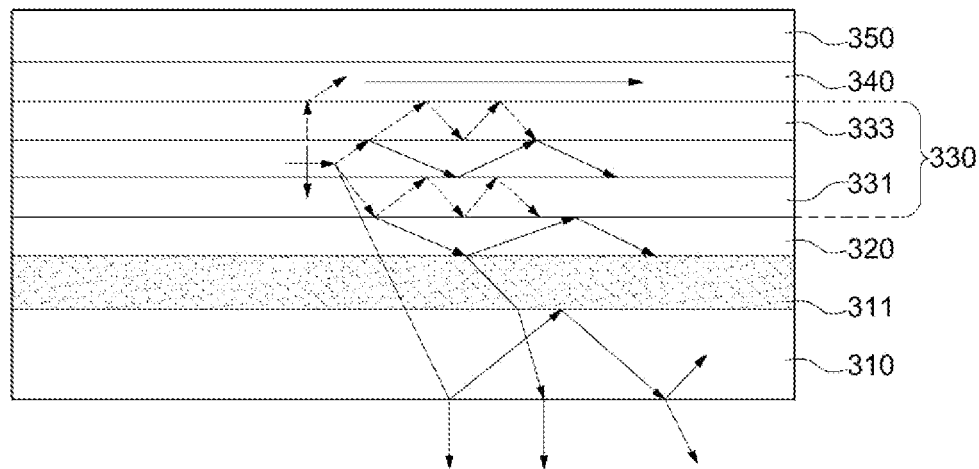
FIG. 3 is a diagram illustrating an OLED device and an optical path within the OLED device according to an exemplary embodiment of the present disclosure.

FIG. 3 is a diagram illustrating an OLED device and an optical path within the OLED device according to an exemplary embodiment of the present disclosure.

Referring to FIG. 3, the OLED device according to an exemplary embodiment of the present disclosure includes a substrate 310, a phase change thin film layer 311 formed on the substrate 310 and formed of a phase change material of which a state is changeable from an amorphous state to a crystalline state or from a crystalline state to an amorphous state, and an anode electrode layer 320, an organic light emitting layer 330 and a cathode electrode layer 340 which are sequentially formed on the phase change thin film layer 311. The organic light emitting layer 330 may include a hole injection/transport layer 311 in a lower part and an electron injection/transport layer 333 in an upper part thereof, and a sealed protection layer 350 configured to protect the device may be formed on the cathode electrode layer 340.

The phase change thin film layer 311 is formed between the substrate 310 and the anode electrode layer 320 to function as a light scattering layer, and may improve light extraction efficiency by dramatically improving loss of waveguide mode light and light in the substrate 310.

The phase change thin film layer 311 may be formed of a phase change material including at least one of a GeSbTe-based material (a crystallization temperature may be further lowered by adding Sb to GST), an InSbTe-based material, an Ag—InSbTe-based material, an SeSbTe-based material and a $Ti_2O_5$-based material in which a phase change is generated even at a low temperature, and may be formed to have a thickness in the range of 100 to 1,000 nm. A crystalline part of the phase change thin film layer 311 in which the crystallization progresses generally has a refractive index in the range of 1.7 to 3.5, and comes to have a refractive index lower by at least 60% than that of an amorphous part, so that a large change in the refractive index is generated.

The phase change thin film layer 311 may be formed by using a sputtering method, a spin coating method, a printing process, and the like. When the phase change thin film layer 311 is first formed, the phase change thin film layer 311 is generally formed of an amorphous film.

The phase change thin film layer 311 may reversibly have an amorphous state or a crystalline state by heat or light supplied from the outside. A method of supplying heat or light may include a heat treatment method using a reaction electric furnace and a method using laser.

Figure 4:
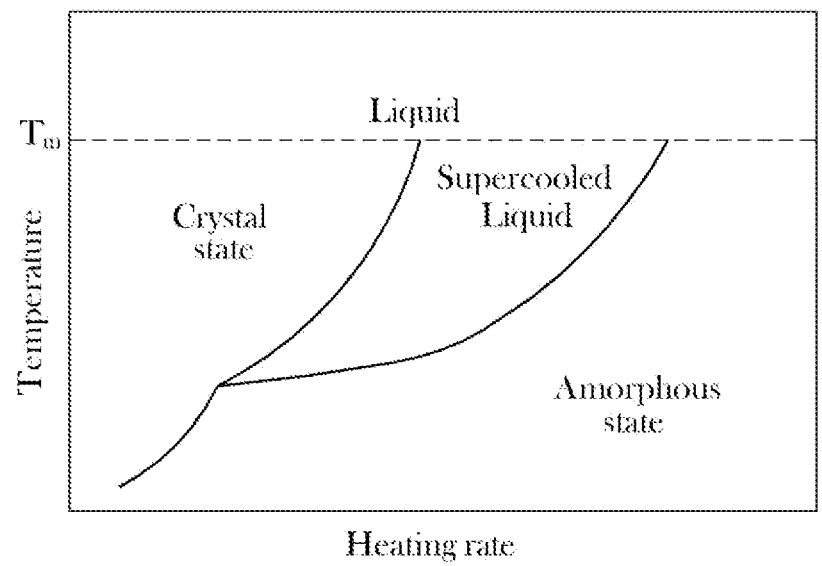
FIG. 4 is a diagram illustrating a change in a state according to a heat treatment condition of a phase change material.

FIG. 4 is a diagram illustrating a change in a state according to a heat treatment condition of a phase change material.

When the heat treatment method is used, as illustrated in FIG. 4, the phase change material constituting the phase change thin film layer 311 may be changed into the amorphous state or the crystalline state depending on a temperature and a heating rate. For example, when heat at a temperature of a melting point Tm or higher is applied to the phase change material at a fast heating rate to the extent to several tens of nsec, and then the phase change material is rapidly cooled, the phase change material becomes the amorphous state. In the meantime, when the heating rate is controlled to be a slightly slow rate in the range of several hundreds of nsec to several msec, the thin film in a crystalline state may be obtained. The phase change material may be in a supercooled liquid state at a certain heating rate and a certain temperature section.

The amorphous state refers to that constitutional elements of atoms within a substance system are in a frozen state by a certain influence, and the amorphous state satisfies thermal equilibrium in a local part within the substance system, but is generally in a non-equilibrium and semi-stable state. Accordingly, when energy is supplied from the outside by heat or light, a phenomenon of an arrangement of the atoms of the substance system is incurred, so that the phase change material becomes a more stable state. Finally, the phase change material is changed to a crystallized state in which a free energy becomes the smallest.

Figure 5:
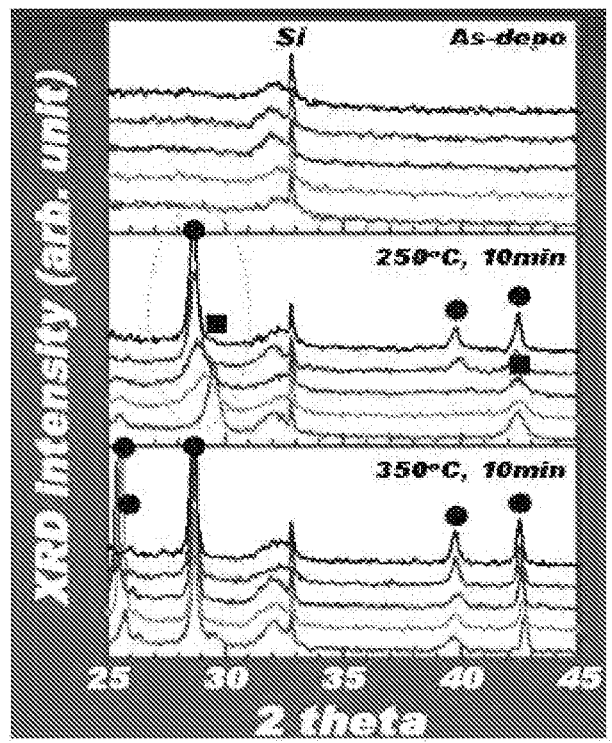
FIG. 5 is a graph of an X-ray diffraction (XRD) measurement illustrating a crystallization state according to a temperature of a phase change material.

FIG. 5 is a graph of an X-ray diffraction (XRD) measurement illustrating a crystallization state according to a temperature of a phase change material. The first graph is a measurement result of an initial amorphous state, the second graph is a measurement result under a condition of a heat treatment at 250° C. for 10 minutes, and the third graph is a measurement result under a condition of a heat treatment at 350° C. for 10 minutes. In the second graph, there is a point indicating a peak value of an XRD intensity, so that it can be seen that the crystallization has been already realized under the condition of the heat treatment at 250° C. for 10 minutes.

Figure 6:
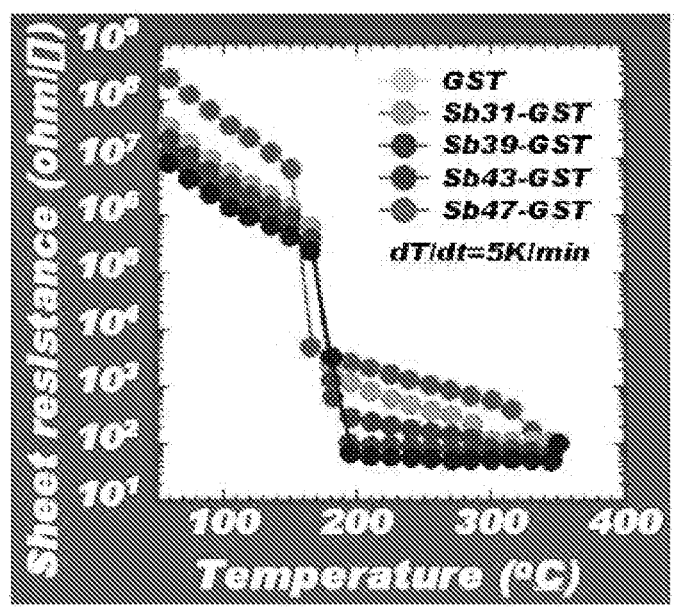
FIG. 6 is a graph illustrating a change in a resistance value according to a change in a temperature in a process of crystallizing a plurality of phase change materials.

The crystallized phase change material has a characteristic in that resistance is changed 1,000 times or more compared to the phase change material in the amorphous state, and thus whether the phase change material is crystallized may be determined through the characteristic. FIG. 6 is a graph illustrating a change in a resistance value according to a change in a temperature during a process of crystallizing a plurality of phase change materials. It can be seen that resistance is sharply increased a temperature in the range of about 160 to 180° C., and it may be identified that crystallization is generated through the increase of the resistance.

Figure 7:
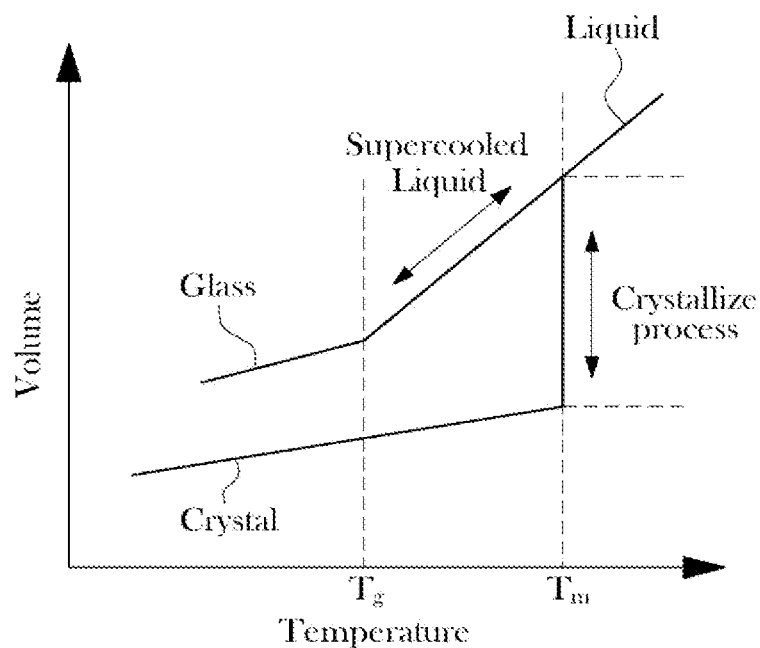
FIG. 7 is a diagram illustrating a volume change according to a state of a phase change material.

In the meantime, when the state of the phase change material is changed to the amorphous state or the crystalline state, a volume is slightly changed. FIG. 7 is a diagram illustrating a volume change according to a state of the phase change material.

As illustrated in FIG. 7, when the phase change material is heated at a temperature of a melting point Tm or higher, the volume is considerably changed depending on a difference of the atom arrangement of the phase change material. In this case, when the phase change material in a state of a large volume (an upper side of the graph) is cooled, the phase change material comes to be in an amorphous glass state through the supercooled liquid state, and when the phase change material in a state of a small volume (a lower side of the graph) is cooled, the phase change material comes to be in a crystalline state. In this case, the volume of the phase change material in the crystalline state is smaller than that of the phase change material in the amorphous state even at the same temperature.

Figure 8A:
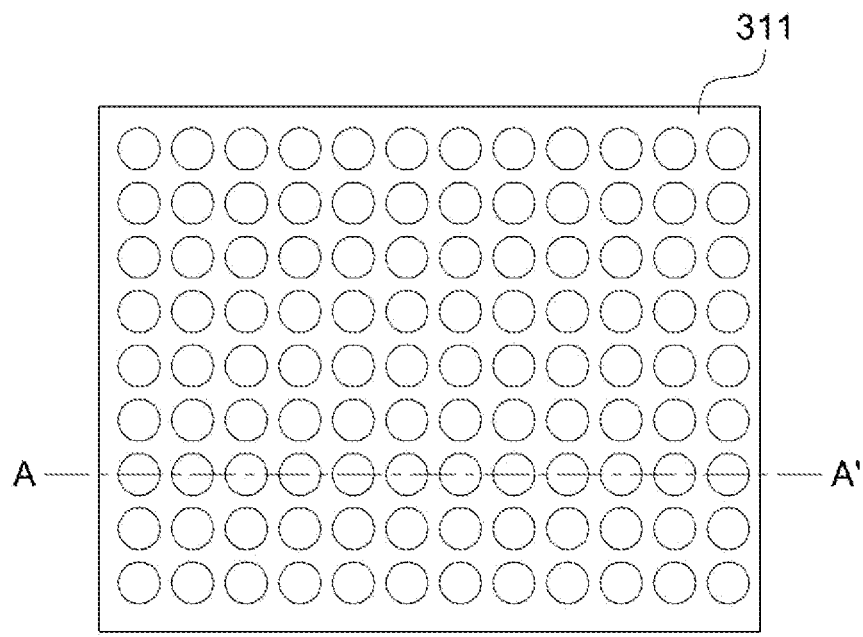
FIGS. 8A and 8B are a plan view and a cross-sectional view illustrating a pattern structure formed on a phase change thin film layer by using laser.
Figure 8B:
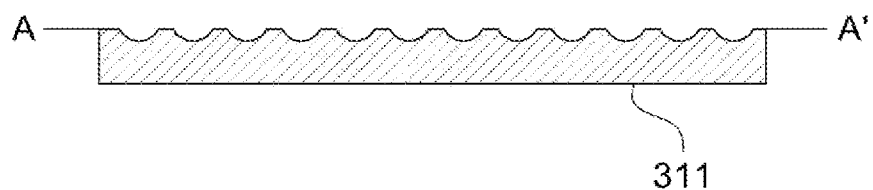

Accordingly, a fine pattern may be formed on the phase change thin film layer 311 by using the aforementioned property. FIGS. 8A and 8B are a plan view and a cross-sectional view illustrating a pattern structure formed on the phase change thin film layer by using laser.

As illustrated in FIGS. 8A and 8B, when laser is radiated to the phase change thin film layer 311 in the amorphous state in a predetermined pattern, the volume is changed due to the crystallization of the phase change material, thereby creating fine surface unevenness. In this case, various patterns may be formed by adjusting a size and a position of a laser spot. Through this, the micro lens array, which had been formed by the very complex and difficult process in the related art, may be formed.

Figure 9:
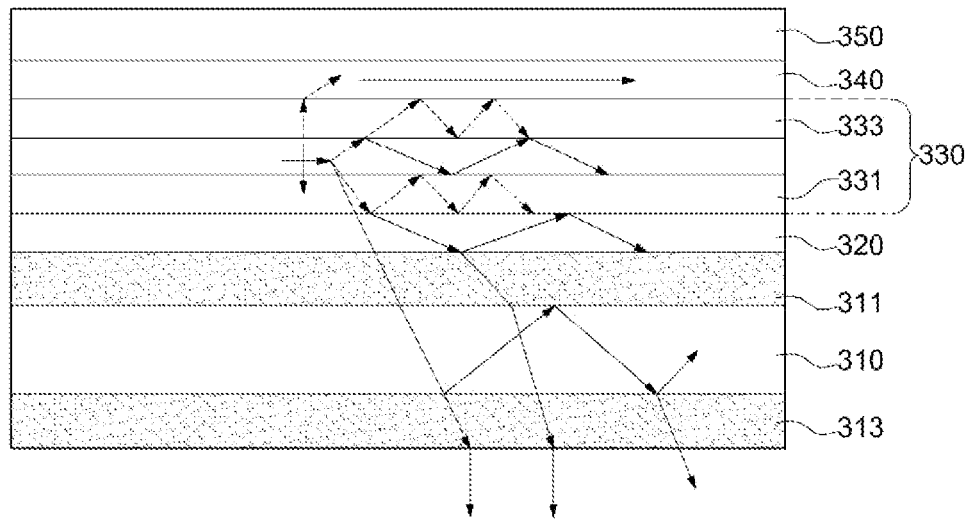
FIG. 9 is a diagram illustrating an OLED device and an optical path within the OLED device according to another exemplary embodiment of the present disclosure.

FIG. 9 is a diagram illustrating an OLED device and an optical path within the OLED device according to another exemplary embodiment of the present disclosure.

Referring to FIG. 9, the OLED device according to another exemplary embodiment of the present disclosure includes a substrate 310, first and second phase change thin film layers 311 and 313 formed on and under the substrate 310, respectively, and formed of a phase change material of which a state is changeable from an amorphous state to a crystalline state or from a crystalline state to an amorphous state, and an anode electrode layer 320, an organic light emitting layer 330 and a cathode electrode layer 340 which are sequentially formed on the first phase change thin film layer 311. The organic light emitting layer 330 may include a hole injection/transport layer 331 in a lower part and an electron injection/transport layer 333 in an upper part thereof, and a sealed protection layer 350 configured to protect the device may be formed on the cathode electrode layer 340.

In the present embodiment, the phase change thin film layer 313 is not only interposed between the substrate 310 and the anode electrode layer 320, but also is additionally formed under the substrate 310, thereby being capable of further improving light extraction efficiency. The characteristic of the phase change material constituting the first and second phase change thin film layers 311 and 313 and the corresponding effect are the same as those described with reference to FIGS. 3 to 8.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An organic light emitting diode (OLED) device, comprising:
   a substrate;
   a phase change thin film layer formed on the substrate and formed of a phase change material changeable from an amorphous state to a crystalline state or from a crystalline state to an amorphous state; and
   an anode electrode layer, an organic light emitting layer and a cathode electrode layer which are sequentially formed on the phase change thin film layer.

2. The organic light emitting diode device of claim 1, wherein a state of the phase change thin film layer is reversibly changeable by heat or light supplied from an outside.

3. The organic light emitting diode device of claim 1, wherein the phase change thin film layer is formed in an amorphous or crystalline state according to a heat treatment condition including a temperature and a heating rate.

4. The organic light emitting diode device of claim 1, wherein a fine unevenness pattern is formed on the phase change thin film layer due to a volume change by laser radiation, and a size and a form of the unevenness pattern are determined by adjusting a size of a laser spot.

5. The organic light emitting diode device of claim 1, wherein the phase change thin film layer is formed of at least one of a GeSbTe-based material, an InSbTe-based material, an Ag—InSbTe-based material, an SeSbTe-based material and a $Ti_2O_5$-based material.

6. The organic light emitting diode device of claim 1, wherein the phase change thin film layer is changed from an amorphous state to a crystalline state, electrical resistance increases 1,000 times or more.

7. The organic light emitting diode device of claim 1, wherein the phase change thin film layer has a refractive index in a range of 1.7 to 3.5 in a crystalline state.

8. The organic light emitting diode device of claim 1, wherein the phase change thin film layer is formed to have a thickness in a range of 100 to 1,000 nm.

9. An organic light emitting diode device, comprising:
   a substrate;
   first and second phase change thin film layers formed on and under the substrate, respectively, and formed of a phase change material changeable from an amorphous state to a crystalline state or from a crystalline state to an amorphous state; and
   an anode electrode layer, an organic light emitting layer and a cathode electrode layer which are sequentially formed on the first phase change thin film layer.

10. The organic light emitting diode device of claim 9, wherein states of the first and second phase change thin film layers are reversibly changeable by heat or light supplied from an outside.

11. The organic light emitting diode device of claim 9, wherein the first and second phase change thin film layers are formed in an amorphous or crystalline state according to a heat treatment condition including a temperature and a heating rate.

12. The organic light emitting diode device of claim 9, wherein a fine unevenness pattern is formed on the first and second phase change thin film layers due to a volume change by laser radiation, and a size and a form of the unevenness pattern is determined by adjusting a size of a laser spot.

13. The organic light emitting diode device of claim 9, wherein the first and second phase change thin film layers are formed of at least one of a GeSbTe-based material, an InSbTe-based material, an Ag—InSbTe-based material, an SeSbTe-based material and a $Ti_2O_5$-based material.

* * * * *